ELECTRICALLY INSULATING MOUNTING SUPPORT STRIP

Filed April 23, 1946

INVENTOR.
HAROLD P. YATES
BY Nelson J. Edge
ATTORNEY

Patented May 15, 1951 2,553,287

UNITED STATES PATENT OFFICE 2,553,287

ELECTRICALLY INSULATING MOUNTING SUPPORT STRIP

Harold P. Yates, Cranford, N. J.

Application April 23, 1946, Serial No. 664,316

2 Claims. (Cl. 174—138)

This invention relates to mounting support strips used to provide mechanical support and electrical terminal connections for small components and has for its object certain improvements in mounting support strips as an article of manufacture and in the method of mounting components.

As is well known in the electrical and electronic industries, insulated support strips, sometimes called terminal boards, are used to provide mechanical support and electrical terminal connections for small component parts such as resistors, capacitors, etc. Up to the present time these supports have usually taken the form of a flat strip of insulation with metal inserts or lugs regularly spaced along two edges of the strip. The electrical terminals of the various component parts are wrapped around the proper set of lugs and the body of the component rests on the insulation support strip. The necessary electrical connections are made to the correct lugs and both the electrical connection and the terminal leads from the component unit are soldered to the lug for a good electrical connection. Because the terminal lugs or inserts either extend through the normally used flat insulation support strip or because the electrical connections thereon would have a possibility of causing electrical short circuits, the entire supporting strip has to be mounted on spacing collars or separators if the component supporting strip is used on a metal or electrical conducting base plate or chassis. In addition, when a flat strip of insulation is used as a base plate for holding these metal inserts or lugs for making the necessary connections, there is, from terminal to terminal and from terminal to common ground through the attaching bolts or rivets, unless they are insulated, an unwanted electrical resistance leakage along the insulation strip, especially if higher frequencies of alternating currents are being used. There are also times, when the various components develop heat in operation in an electrical circuit and the radiation of such heat is impaired when the body of the component is mounted in such relation to the insulation strip that the free circulation of air around the component body is restricted.

As a result of my investigations, I have discovered improvements in mounting support strips which overcome to a great extent these disadvantages. By using a mounting support in which finger-like projections extend from a base plate and by having these extensions not in the same plane as the base plate and by locating the proper terminal mounting areas on these finger-like projections; I have found that resistance leakage is reduced because of longer travel between terminal to terminal and terminal to common ground, that the complete support can also be mounted directly on a metal chassis without spacing collars or washers and that the components, if necessary, can be exposed to a free circulation of air. In addition to these advantages, the terminal lugs of supplementary components such as vacuum tube sockets, switches, etc., can be brought through the base plate of this mounting strip for short, direct electrical connections to the proper mounting areas on the finger-like projections. The need for metal inserts or soldering lugs in the mounting strip is also eliminated; the flexible terminal leads of various components are affixed at the proper mounting areas on the finger-like projections by the use of notches, holes or slots, if necessary, and the proper electrical connection is then made, soldering directly to the component terminal lead.

Other objects of this invention will in part be obvious and in part hereinafter pointed out. The invention accordingly consists in the features of construction, combinations of elements, and arrangements of parts which will be exemplified in the construction hereinafter described and of which the scope of application will be indicated in the following claims. In the accompanying drawing, in which are shown three of the various possible illustrative embodiments of this invention, Figure 1 is a top elevational view of a mounting support strip embodying the present invention.

Figures 1, 2, 3:
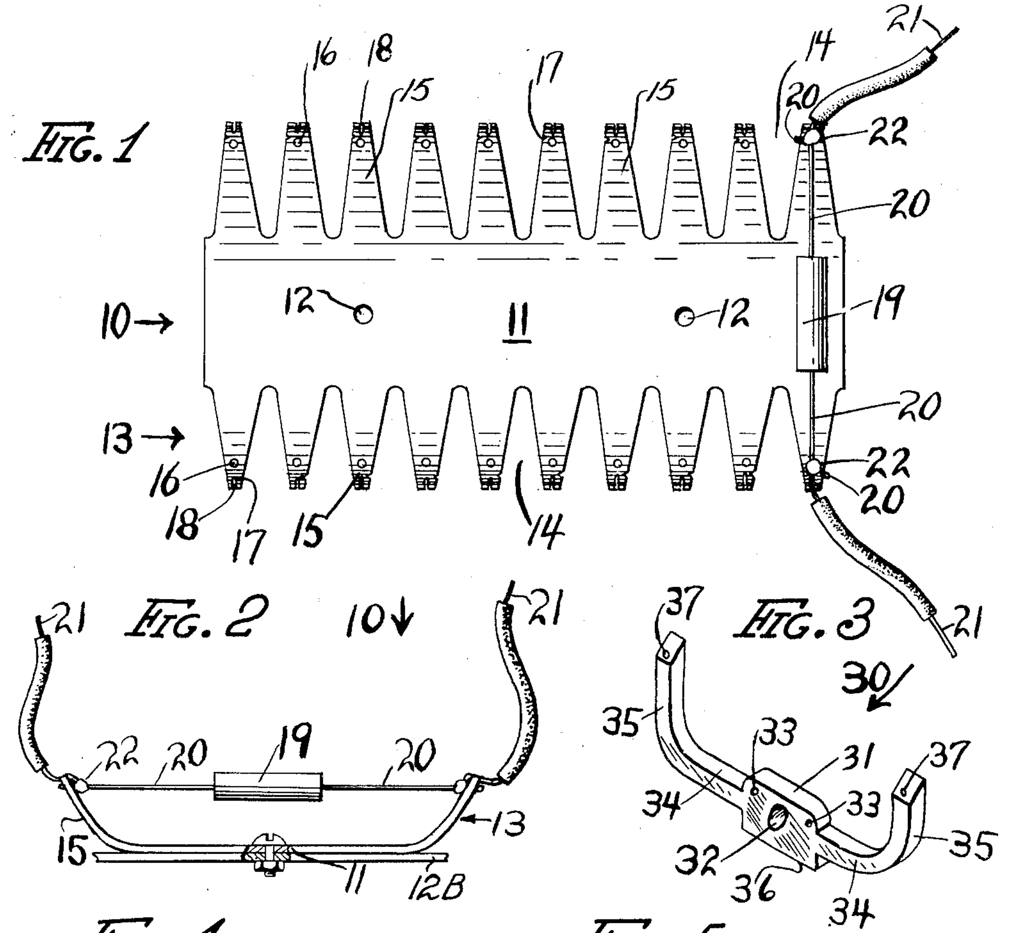
Figure 2 is an end elevation thereof.
Figure 3 is a perspective view of a modified form of the invention.

Referring now in detail to the drawings, and in particular to Figures 1 and 2 thereof, my improved mounting support strip 10 is constituted exclusively of a sheet of insulating material comprising the substantially flat elongated base plate portion 11 formed with the holes 12 extending perpendicularly to the plane thereof. By means of the holes 12 and bolts 12A, the base plate portion 11 may be affixed to a chassis 12B. The terminal mounting portions 13 are integral with the base plate portion 11 and extend thereto so that successive points along their length proceeding outward from base plate 11 are progressively further separated from the plane of base plate 11.

As illustrated, the terminal mounting portions 13 are formed with recesses 14 extending inwardly from the longitudinal boundaries of strip 10 so as to be divided into a plurality of projecting fingers 15. Fingers 15 are all located on the same side, namely the upper side, of strip 10 in operative position as illustrated particularly in Figure 2, and further extend from the base plate or body portion 11 in oppositely extending pairs, the longitudinal axis of a pair of oppositely extending fingers being substantially perpendicular to the longitudinal axis of sheet or strip 10 and base plate portion 11. Adjacent their outer ends, the fingers 15 are formed with the holes 16 extending through their thickness and with the notches 17 on one side thereof, and the slots 18 extend inward from their outer end for a purpose to be described.

A component 19, such as a resistor or capacitor, comprising flexible terminal lead portions 20 may be conveniently mounted between opposite members of a pair of the fingers 15, as illustrated in Figures 1 and 2. Each flexible lead 20 of component 19 is led through a respective hole 16, and the lead wire 21 to be connected thereto is led through notch 18, under lead 20, and back on itself, and the free end of lead 20 is then brought around from the underside of finger 15 in Figure 1 and crossed over itself and the mechanical and eletcrical connection completed by a drop of solder 22.

The mounting strip 10 is of insulating material, a satisfactory material being laminated paper bonded with a phenolic resin. The particular composition of the strip 10 is of course not important to the present invention, such insulating materials being well known in the art. The strip 10 thus provides a form of terminal board which is of unitary construction, very cheap to make, and provides easy means for mounting components in their respective circuits. The amount of solder required is very small, and the time to apply it is correspondingly small, because of the comparatively small amount of metal which must be heated in order to make the connection, as compared to soldering the leads 20 and 21 to a metal terminal post as is done in common practice. The base plate 11 may further be directly attached to an electrically conductive chassis, since it is of insulating material. The recesses 14 serve the well known function of improving the insulation between adjacent connections, and are, of course, not essential in the practice of my invention.

Referring now to Figure 3, a mounting support 30 is illustrated suitable for building up into special designs for experimental work. The mounting support 30 is preferably constructed of steatite, though any other insulating material is also satisfactory. The support 30 has a substantially rectangular body 31 through the thickness of which extend the comparatively large, centrally located hole 32 and the smaller holes 33 near the upper corners thereof. Extending longitudinally from the ends of the body 31 are the arm portions 34, the latter comprising the terminal mounting portions 35 extending at an angle to the plane of body 31, in the sense that the length of the terminal mounting portions 35 is illustrated as extending substantially vertically whereas body 31 is illustrated as extending substantially horizontally. With further reference to the angular inclination of the terminal mounting portions 35 to body 31, it may be stated that the under surface 36 of body 31 is intended to be mounted in contact with a chassis, and presuming the latter to be horizontal, the terminal mounting portions 35 would be vertical. The mounting of body 31 on the chassis is accomplished by means of a bolt, not illustrated, which can extend through the central hole 32 of any desired number of supports 30, said supports 30 preferably being spaced longitudinally of the connecting bolts by spacers in conventional manner. Holes 37 extend transversely through the terminal mounting portions 35 adjacent the ends thereof. It is thus evident that a component, not illustrated, may be mounted, in manner similar to the mounting of component 19 in Figures 1 and 2, by leading the flexible leads thereof through both of the holes 37 or, alternatively, through a hole 37 and a hole 33.

Figure 4:
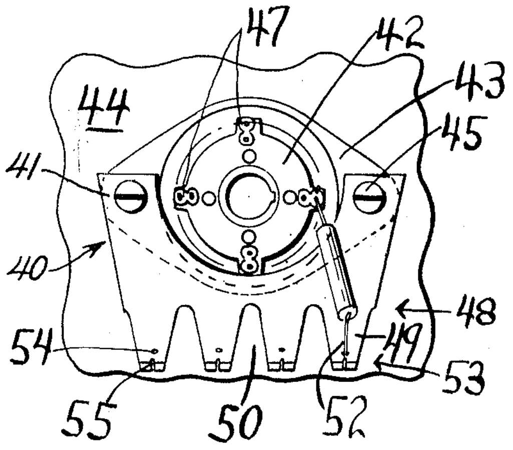
Figure 4 is a bottom elevational view of another modified form of the invention.
Figure 5:
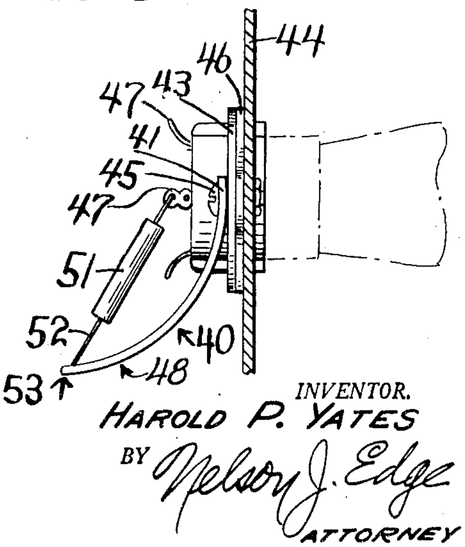
Figure 5 is a side elevational view thereof.

In Figures 4 and 5 is illustrated a further modification of my invention. In these figures the mounting strip 40 comprises the base plate portion 41 as its main body portion, base plate portion 41 being substantially flat and cut out semicircularly to receive a radio tube socket, 42. Said socket 42 comprises a metal plate 43 and, as illustrated, the component mounting strip 40 is mounted on a chassis 44 by means of screws 45 passing through its base plate portion 41, also through metal plate 43, a gasket 46 and chassis 44. The socket 42 is illustrated as comprising four soldering lugs 47.

The mounting strip 40 is of insulating material, and integral construction. Extending continuously from the base plate or main body portion 41 in a curved plane tangent to the plane of base plate portion 41, is the terminal mounting portion 48, the latter comprising the fingers 49 separated by the recesses 50. A component 51 comprising flexible terminal lead portions 52 may be electrically connected to the soldering lug 47 of the socket 42, and further supported at the terminal mounting area 53 adjacent the outer end of any of the fingers 49, the latter comprising the holes 54 and slots 55 similar in purpose and constructions to holes 16 and slots 18 of Figures 1 and 2.

It is thus seen that in all the figures, I have provided support means for components, the support means comprising portions for attachment directly to a chassis and portions integral with the first portion and extending away from the plane of the portion and chassis so that the component is supported in spaced relation to the chassis and to the mounting strip or means. In each of the forms illustrated, the mounting support consists of a single, integral piece of insulating material which may be directly mounted on an electrically conductive chassis and provide suitable mounting for electrical components, at a very small cost for the mounting support and providing easier means of soldering the components into mechanical and electrical contact with their desired circuits.

It will thus be seen that there is provided a device in which the several objects of this invention are achieved, and which is well adapted to meet the conditions of practical use. As various possible embodiments might be made of the above invention, and as various changes might be made in the embodiments above set forth, it is to be understood that all matter herein set forth or shown in the accompanying drawing is to be interpreted as illustrative and not in a limiting sense.

I claim:

1. An electro mechanical mounting construction, comprising the combination of a sheet of insulating material, said sheet being of substantially uniform thickness, said sheet further comprising a body portion and finger portions extending angularly thereto and in opposite directions therefrom on the same side of said sheet, said finger portions being formed with foraminations adjacent their outer ends, a chassis, an electrical component comprising flexible terminal lead portions, said body portion being firmly connected to said chassis, said terminal lead portions extending through the foraminations of a pair of oppositely disposed finger portions, electrically conductive members operatively disposed relative to said terminal lead portions and solder directly mechanically and electrically connecting said terminal lead portions to said electrically conductive members.

2. In an elongated mounting strip for electrical components and the like, a sheet of insulating material of substantially uniform thickness, said sheet comprising the combination with a body portion, said body portion comprising a portion extending in a substantially flat plane, of a plurality of finger portions integral with said body portion and extending outside said plane, said finger portions being formed adjacent their outer ends with foraminations, said finger portions further extending in oppositely extending pairs on the same side of said sheet, the longitudinal axis of a pair of finger portions being substantially perpendicular to the longitudinal axis of said sheet.

HAROLD P. YATES.

REFERENCES CITED

The following references are of record in the file of this patent:

UNITED STATES PATENTS

| Number | Name | Date |
|---|---|---|
| 405,546 | Frist | June 18, 1889 |
| 1,691,088 | Starke | Nov. 13, 1928 |
| 1,710,512 | Pitt | Apr. 23, 1929 |
| 1,729,873 | Hengstenberg | Oct. 1, 1929 |
| 1,993,494 | Weiscopf | Mar. 5, 1935 |
| 2,066,876 | Carpenter | June 5, 1937 |
| 2,176,212 | Dijksterhuis | Oct. 17, 1939 |
| 2,244,009 | Hiensch et al. | June 3, 1941 |

FOREIGN PATENTS

| Number | Country | Date |
|---|---|---|
| 17,839 | Great Britain | Nov. 26, 1892 |